United States Patent
Zhang et al.

(10) Patent No.: US 11,609,273 B2
(45) Date of Patent: Mar. 21, 2023

(54) METHOD AND SYSTEM FOR OPTIMIZING BMS MODEL, STORAGE MEDIUM AND ELECTRIC VEHICLE

(71) Applicant: Guangzhou Automobile Group Co., Ltd., Guangdong (CN)

(72) Inventors: Jiucai Zhang, Guangdong (CN); Jun Wang, Guangdong (CN); Chao Liu, Guangdong (CN); Jin Shang, Sunnyvale, CA (US); Qiang Ren, Guangdong (CN); Ao Mei, Guangdong (CN); Dadiao Ning, Guangdong (CN); Sichao Guo, Guangdong (CN); Sheng Hui, Guangdong (CN)

(73) Assignee: GUANGZHOU AUTOMOBILE GROUP CO., LTD., Guangzhou (CN)

( * ) Notice: Subject to any disclaimer, the term of this patent is extended or adjusted under 35 U.S.C. 154(b) by 171 days.

(21) Appl. No.: 17/120,295

(22) Filed: Dec. 14, 2020

(65) Prior Publication Data

US 2022/0187374 A1 Jun. 16, 2022

(51) Int. Cl.
*G01R 31/367* (2019.01)
*G01R 31/36* (2020.01)
*H01M 10/42* (2006.01)
*G01R 31/374* (2019.01)

(52) U.S. Cl.
CPC ....... *G01R 31/367* (2019.01); *G01R 31/3648* (2013.01); *G01R 31/374* (2019.01); *H01M 10/425* (2013.01); *H01M 2010/4271* (2013.01); *H01M 2220/20* (2013.01)

(58) Field of Classification Search
CPC ........................... G01R 31/374; G01R 31/367
USPC ......................................................... 702/63
See application file for complete search history.

(56) References Cited

U.S. PATENT DOCUMENTS

| | | | |
|---|---|---|---|
| 2016/0093927 A1* | 3/2016 | Marcicki | H01M 10/0525 |
| | | | 429/50 |
| 2017/0108551 A1* | 4/2017 | Aliyev | G01R 31/367 |
| 2020/0164763 A1* | 5/2020 | Holme | B60L 58/10 |
| 2020/0269722 A1* | 8/2020 | Aykol | G05B 13/048 |
| 2022/0126723 A1* | 4/2022 | Ferguson | B60L 3/0046 |

OTHER PUBLICATIONS

Li et al., "Big data driven Lithium-ion battery modeling method: a Cyber-Physical System approach," Aug. 2019, IEEE, pp. 161-166. (Year: 2019).*

* cited by examiner

*Primary Examiner* — Ricky Go
(74) *Attorney, Agent, or Firm* — ScienBiziP, P.C.

(57) ABSTRACT

Provided are a method and a system for optimizing a BMS model. The method includes: creating a BMS model based on test data of a battery; selecting sample vehicles from real driving data of vehicles equipped with this type of battery through active learning approach, and giving a corresponding weight to each of the selected sample vehicles; optimizing the BMS model based on the data of the selected sample vehicles.

18 Claims, 5 Drawing Sheets

METHOD AND SYSTEM FOR OPTIMIZING BMS MODEL, STORAGE MEDIUM AND ELECTRIC VEHICLE

TECHNICAL FIELD

The present disclosure relates to the field of battery modeling and battery management system (BMS) algorithm design, and particularly to a method and system for optimizing a BMS model, a storage medium and an electric Vehicle.

BACKGROUND

Battery modeling and BMS algorithm design usually require laboratory batter test data and calibration data during vehicle driving. Battery laboratory test data is generally used as the basis for establishing the BMS algorithm model, and a large number of performance tests such as capacity, internal resistance, and power are required. After the basic algorithm model is established, the model parameters are optimized through the test and calibration of actual vehicle models. In order to obtain the model parameters with higher control accuracy and adapt to the corresponding vehicle models, a lot of the battery test data is needed when building the model. These tests often take up a lot of manpower, material resources and time costs, and reduce the development progress of the BMS system. Laboratory battery tests are generally designed based on experience, and the experiment lacks theoretical guidance and has a certain gap with actual use. As a result, the BMS algorithm model built based on the laboratory battery test data often fails to fit the actual use conditions of the vehicles and the real driving habits of the users, and the accuracy of BMS algorithm model need to be further improved.

It is to be noted that the information disclosed in this background of the disclosure is only for enhancement of understanding of the general background of the present disclosure and should not be taken as an acknowledgement or any form or suggestion that this information forms the prior art already known to a person skilled in the art.

SUMMARY

Embodiments of the present disclosure provide methods and system for optimizing a BMS model, storage Medium and an electric Vehicle, and intend to solve the problem of the accuracy of BMS algorithm model need to be further improved.

According to one aspect of the present disclosure, a method for optimizing a BMS model is provided. The method comprises the following steps: creating a BMS model based on test data of a battery; selecting sample vehicles from real driving data of vehicles equipped with this type of battery through active learning approach, and giving a corresponding weight to each of the selected sample vehicles; optimizing the BMS model based on the data of the selected sample vehicles.

In an exemplary embodiment, after the step of optimizing the BMS model based on the data of the selected sample vehicles, the method further comprises: performing an error evaluation on the optimized BMS model, and when the optimized BMS model meets a preset accuracy requirement, outputting parameters of the optimized BMS model.

In an exemplary embodiment, after the step of performing an error evaluation on the optimized BMS model, the method further comprises: when the optimized BMS model does not meet a preset accuracy requirement, reselecting sample vehicles from real driving data of vehicles equipped with the battery through the active learning approach, and optimizing the BMS model based on the data of the reselected sample vehicles.

In an exemplary embodiment, the step of reselecting sample vehicles from real driving data of vehicles equipped with the battery through the active learning approach comprises: discarding part of the sample vehicles in which the information entropy is greater than a threshold value; reselecting part of sample vehicles from real driving data of vehicles equipped with the battery through the active learning approach.

In an exemplary embodiment, the step of selecting sample vehicles from real driving data of vehicles equipped with the battery through active learning approach comprises: selecting the sample vehicles from real driving data of vehicles equipped with the battery based on a battery characteristic similarity between the sample vehicles and the target vehicle.

In an exemplary embodiment, the step of selecting the sample vehicles from real driving data of vehicles equipped with the battery based on a battery characteristic similarity between the sample vehicles and the target vehicle comprises: determining the battery characteristic similarity between the sample vehicles and the target vehicle according to the information entropy of the sample vehicles; selecting the sample vehicles from real driving data of vehicles equipped with the battery based on the information entropy of vehicles equipped with the battery.

In an exemplary embodiment, the battery characteristic comprises at least one of the following: chemical characteristics of the battery, the number of series/parallel connections of the battery, and a used time of the battery.

In an exemplary embodiment, the parameters of the BMS model comprise at least one of the following: model order, a battery charge state, an open circuit voltage, an internal resistance, a terminal voltage, and a capacitor. In an exemplary embodiment, According to another aspect of the present disclosure, a system for optimizing a BMS model is also provided. The system comprises a creation module, a selection module and an optimization module. The creation module is configured to create a BMS model based on test data of a battery. The selection module is configured to select sample vehicles from real driving data of vehicles equipped with this type of battery through active learning approach, and give a corresponding weight to each of the selected sample vehicles. The optimization module is configured to optimize the BMS model based on the data of the selected sample vehicles.

In an exemplary embodiment, the system further comprises an evaluation module and an outputting module. The evaluation module is configured to perform an error evaluation on the optimized BMS model, and the outputting module is configured to, when the optimized BMS model meets a preset accuracy requirement, output parameters of the optimized BMS model.

According to another aspect of the present disclosure, a non-volatile computer readable storage medium is also provided. A program is stored in the non-volatile computer readable storage medium, and the program is configured to be executed by a computer to perform the steps of methods in above-mentioned embodiments.

According to another aspect of the present disclosure, an electric vehicle is also provided. The electric vehicle includes the system for optimizing a BMS model in above-mentioned embodiments.

In the above-mentioned embodiments of the present disclosure, the real driving data of various vehicles equipped with this type of battery are selected through the active learning approach, and the selected data is used to optimize the design of the battery model and BMS algorithm, thereby reducing the demand for laboratory battery test data. In addition, the real driving data selected by using the active learning approach fit the actual condition of the vehicles and the driving habits of the users, which is beneficial to improve the control accuracy of the BMS algorithm model.

BRIEF DESCRIPTION OF THE DRAWINGS

The drawings described here are adopted to provide a further understanding to the present disclosure and form a part of the application. Schematic embodiments of the present disclosure and descriptions thereof are adopted to explain the present disclosure and not intended to form limits to the present disclosure. In the drawings.

DETAILED DESCRIPTION OF THE EMBODIMENTS

The present disclosure will be described below with reference to the drawings and in combination with the embodiments in detail. It is to be noted that the embodiments in the application and characteristics in the embodiments may be combined without conflicts.

For electric vehicles, the BMS controls the use of batteries and is one of the core control systems used in electric vehicles. The BMS algorithm design method generally requires battery cell laboratory test data and a large amount of calibration data during vehicle driving. The battery laboratory test data is generally used as the basis for establishing these algorithms. After the basic algorithm model is established, the model parameters are corrected through the test and calibration of actual vehicle models. The problem with this method is that in the initial stage of the establishment of the BMS model, a large number of tests on the battery cells are required in the laboratory to obtain performance data such as the capacity, internal resistance, and power of the cells. These tests often take up a lot of test resources, and require a lot of test funding costs, and at the same time, the test cycle is long, which also brings a lot of pressure on the vehicle development cycle.

In order to solve at least one of the problems mentioned above, some embodiments are provided in the present application. In these embodiments, solutions are provided to reduce the amount of battery laboratory testing by using active learning, and these solutions can be used in battery modeling, BMS algorithm design, test calibration of electric vehicles, and electric vehicle operation management and so on.

Embodiment 1

In the present embodiment, a method for optimizing a BMS model is provided by the present embodiment. In the present embodiment, the amount of battery cell laboratory testing is reduced by using an active learning approach. This method uses the actual driving data of various models of battery applications, uses active learning to select sample data that is most suitable for the model and the user, and optimizes laboratory testing based on these data to achieve accurate testing, and uses accurate test data to optimize and design the cell/battery model and BMS algorithm, reduce the demand for cell laboratory testing and improve the accuracy of the model and battery performance. In addition, the active learning technology can also optimize the personalized parameters of the BMS according to user habits by actively learning the local data of the vehicle to achieve the purpose of optimizing battery characteristics.

Figure 1:
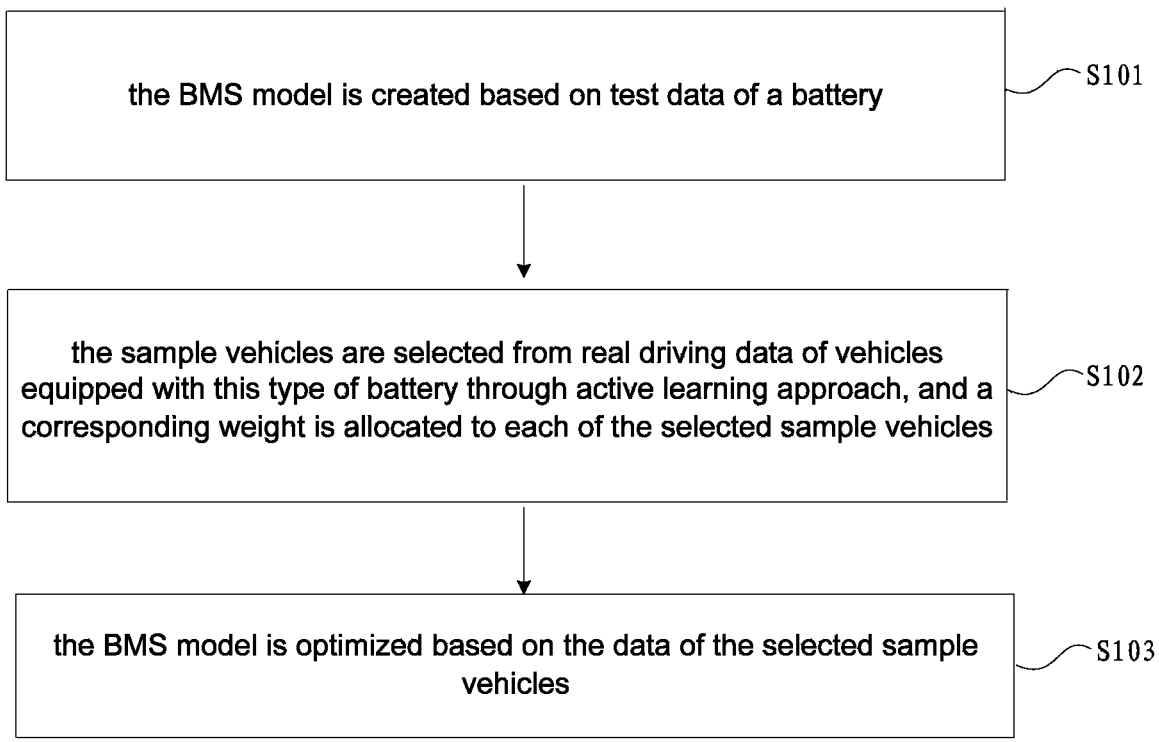
FIG. 1 is a flowchart of a method for optimizing a BMS model according to an embodiment of the present disclosure.

As shown in FIG. 1, the method includes the following steps.

At S101, the BMS model is created based on test data of a battery.

At S102, the sample vehicles are selected from real driving data of vehicles equipped with this type of battery through active learning approach, and a corresponding weight is allocated to each of the selected sample vehicles;

At S103, the BMS model is optimized based on the data of the selected sample vehicles.

In the present embodiment, after the step of S 103, the method may further comprise: performing an error evaluation on the optimized BMS model, and when the optimized BMS model meets a preset accuracy requirement, outputting parameters of the optimized BMS model.

In the present embodiment, after the step of performing an error evaluation on the optimized BMS model, the method may further comprise: when the optimized BMS model does not meet a preset accuracy requirement, reselecting sample vehicles from real driving data of vehicles equipped with the battery through the active learning approach, and optimizing the BMS model based on the data of the reselected sample vehicles.

In the present embodiment, the step of reselecting sample vehicles from real driving data of vehicles equipped with the battery through the active learning approach comprises: discarding part of the sample vehicles in which the information entropy is greater than a threshold value; reselecting part of sample vehicles from real driving data of vehicles equipped with the battery through the active learning approach.

In the step of S101 of the present embodiment, the sample vehicles are selected from real driving data of vehicles equipped with the battery based on a battery characteristic similarity between the sample vehicles and the target vehicle.

In the present embodiment, the step of selecting the sample vehicles from real driving data of vehicles equipped with the battery based on a battery characteristic similarity between the sample vehicles and the target vehicle may further comprise: determining the battery characteristic similarity between the sample vehicles and the target vehicle according to the information entropy of the sample vehicles; selecting the sample vehicles from real driving data of vehicles equipped with the battery based on the information entropy of vehicles equipped with the battery.

In the present embodiment, the battery characteristic may comprise at least one of the following: chemical characteristics of the battery, the number of series/parallel connections of the battery, and a used time of the battery.

In the present embodiment, the parameters of the BMS model may comprise at least one of the following: model order, a battery charge state, an open circuit voltage, an internal resistance, a terminal voltage, and a capacitor.

Embodiment 2

In the present embodiment, the basic battery models and BMS algorithms are established based on the limited laboratory battery test data, and then collect real driving data of vehicles equipped with this type of battery through active learning approach, performance the optimization battery test experiments based on the collect data, and use test results to optimize battery model and BMS algorithm parameters.

Figure 2:
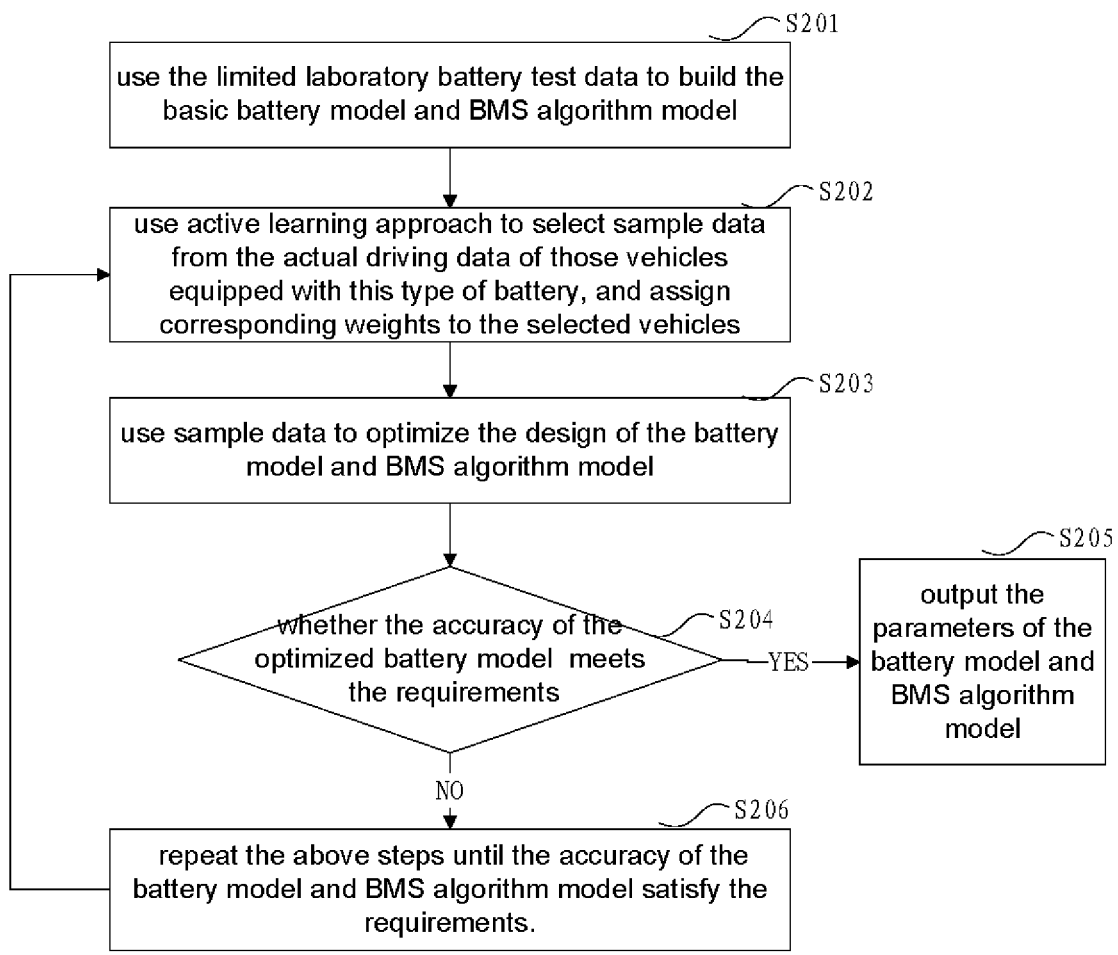
FIG. 2 is a flowchart of a method for optimizing a BMS model according to another embodiment of the present disclosure.

FIG. 2 is a flowchart of method for optimizing a BMS model according to an embodiment of the present disclosure. As shown in FIG. 2, the method includes the following steps.

At S201, use the limited laboratory battery test data to build the basic battery model and BMS algorithm model.

In the present embodiment, the battery test data may include capacity, internal resistance, power, open circuit voltage (OCV) and other data.

At S202, use active learning approach to select sample data from the actual driving data of those vehicles equipped with this type of battery, and assign corresponding weights to the selected vehicles.

In the present embodiment, the selected sample data is closer to the actual working conditions and driving behaviors of the users, and environment, etc.

At S203, use sample data to optimize the design of the battery model and BMS algorithm model.

In the present embodiment, the BMS model parameters may include: model order, battery state of charge, open circuit voltage, internal resistance, terminal voltage, capacitance and other parameters.

At S204, evaluate the error of the battery model and BMS algorithm model.

At S205, when the accuracy of the optimized battery model and BMS algorithm model meets the requirements, then output the parameters of the battery model and BMS algorithm model, At S206, when the accuracy of the optimized battery model and BMS algorithm model do not meet the requirements, then repeat the steps S202 and S203 until the accuracy of the battery model and BMS algorithm model satisfy the requirements.

In the present embodiment, the reason for the optimization is that the optimal design of the BMS system through the active learning method makes full use of the actual user's driving data, which greatly reduces the demand for laboratory test data. At the same time, it is closer to the driving habits of actual users than the general BMS optimization method that uses prototype vehicle calibration.

In the present embodiment, first, the active learning method is used to randomly select the target vehicle from the driving data of vehicles equipped with this type of battery, and the query algorithm is used to obtain the similar vehicles and the weight of each vehicle. This step can be based on the characteristic similarity of the battery system of different models of vehicles, and the characteristic similarity may include: the chemical characteristics of the battery cell, the number of series and parallel connections, the used time, etc.

The specific active learning method is as follows: suppose the selected qualified vehicle set is A, the corresponding weight set is B, the battery system parameter of the target vehicle is O, the query method function is Q, the marking method is I, and the selected random vehicle set is U. Then the selection process of random vehicles in the active learning process can be expressed as: (A, B)=(O, Q, I, U). The query function Q is used to query the battery system of the target vehicle as a similar sample. Commonly used methods include the information entropy method. Note that the smaller the information entropy is, the most similar to the target vehicle.

In the present embodiment, the information entropy can be evaluated by chemical system C, string number P, parallel number S, and use time T, etc., through various types of error evaluation functions F (C, P, S, T), such as the least squares to judge whether the selected vehicle meets the selection criteria. If yes, enter the set A through the marking function I. After all the target vehicles are selected, the weight set B corresponding to each vehicle in the set A is obtained through the error evaluation function.

Subsequently, the battery model and the BMS parameters are optimized by utilizing the selected driving data of the vehicles, and the BMS parameters may include: battery state of charge, open circuit voltage, internal resistance, terminal voltage, capacitance and other parameters. When the accuracy of the model meets the demand, the iteration of the model is stopped.

In the present application, if the selected vehicle cannot meet the optimization accuracy of the BMS model, one way is to use the active learning method to re-select the sample vehicles randomly, and start the next round of BMS model optimization and accuracy evaluation. Another way is to retain some of the sample vehicles with low information entropy, because these sample vehicles have a high degree of similarity to the target vehicle. The rest of the sample vehicles with large information entropy are discarded, and then randomly select some samples from the total sample library to perform active learning and screening again to obtain qualified samples. The advantage of this way is that each time the vehicle samples with the highest similarity are obtained through the active learning, and avoiding repeated learning of some samples to a certain extent, and speeding up the convergence speed.

In the present application, after selecting the vehicle models, we can use the driving data of the selected vehicle to create a battery profile. The battery profile may includes SOC distribution, current distribution, voltage distribution, balanced differential pressure distribution, power distribution, energy distribution, balanced differential pressure and other battery parameters, and optimize the test range and test methods such as batteries and packs based on the battery profile, so that we can use very few tests and data to make algorithms and models suitable for the current model. In addition, for life prediction, the test cycle is relatively long and there are many test items. If we can determine the test content through the actual product data, it will be very close to the actual use and will reduce the test items. The model is also more suitable for market products. If user habits are taken into consideration, active learning can learn some personalities of the car owner, so that the parameters of the BMS can be optimized through these personalities to achieve the purpose of optimizing battery characteristics.

In the present embodiment, through the active learning method, the actual driving data of various types of vehicles equipped with this type of battery are selected, and the selected data is used to optimize the design of the BMS algorithm, thereby reducing the demand for laboratory battery test data and being closer to the actual use habits of users, which helps to improve the control accuracy of the BMS algorithm.

For the better understanding of the embodiments of the present disclosure, the active learning method will be described in detail below.

In the embodiments of the present disclosure, the objective of active learning is to optimize battery model and management algorithms by selecting the most informative training instances. A core assumption in active learning is that the learning algorithm will perform better with less training when it is allowed to choose the data from which it learns. In laboratory we run a test based on the engineer's heuristic design of the experiments, and we do not know the true distributions of driving profiles of the new model. Our task is to select a few auxiliary vehicles in the field such that their distribution of driving profiles of the drivers is more informative. The easiest way is to do random selection or use all auxiliary vehicle data. The random selection may not provide new information as they have no impact on the battery model and battery management algorithm design. The all auxiliary vehicle data may provide too much unusual data and reduce the efficiency of the battery model and battery management algorithm development.

The goal of active learning is to select the most informative auxiliary vehicles. The key problem is how to select the most informative auxiliary vehicles. In the context of battery modeling and management, active learning tries to reduce the total predictive variance. An optimal myopic selection is achieved by choosing the point which optimize accuracy of the battery model and management algorithms through turning the parameters for new model vehicles.

Figure 3:
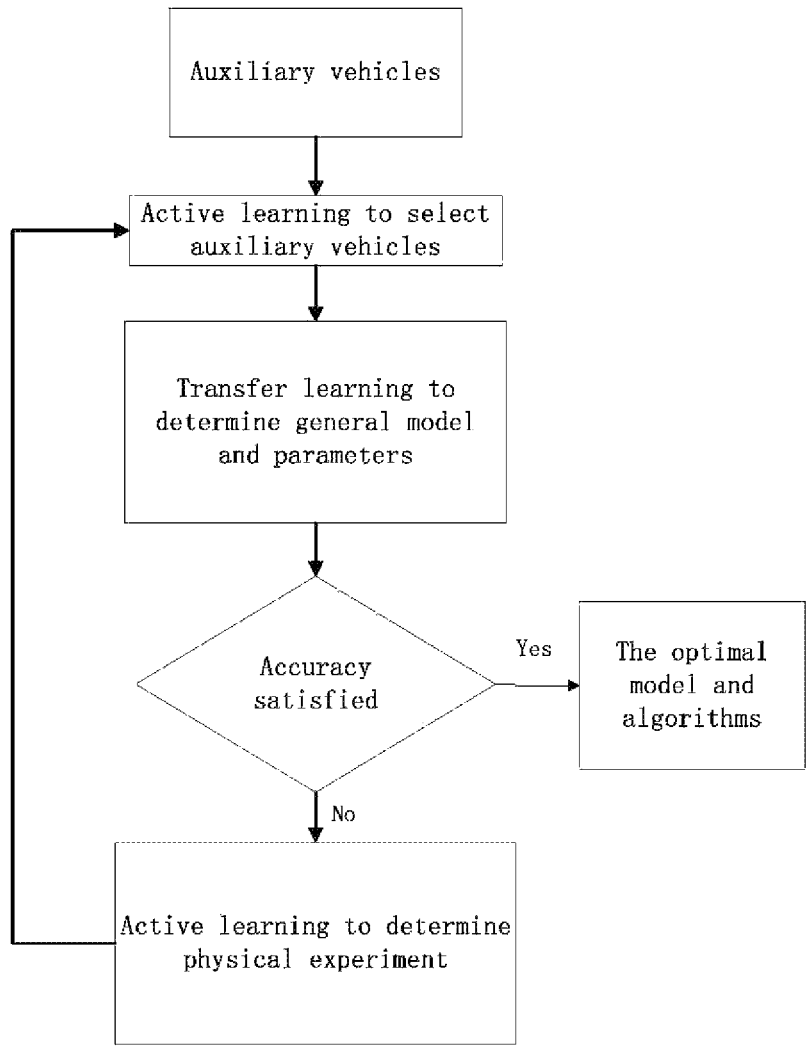
FIG. 3 is a schematic diagram of active learning according to an embodiment of the present disclosure.

Active learning considers how to optimally select the most informative auxiliary vehicles. The battery model learning and battery algorithm design consider how to make use of data from other auxiliary vehicles. The fundamental concept is to use active learning to select the most informative auxiliary vehicles, and then use data from auxiliary vehicles to derive the optimal battery model, battery management algorithms, and corresponding parameters for the new model vehicles based on available data obtained from the auxiliary vehicle until the desired accuracy is obtained, or the maximum number of iterations is reached, as illustrated in FIG. 3.

Embodiment 3

In the present embodiment, a system for optimizing a BMS model is also provided. The system can be applied to a cloud-based server or an on-board computing device, and is configured to implement the abovementioned embodiments with preferred implementation modes. What has been described will not be elaborated. For example, term "module", used below, may be a combination of software and/or hardware realizing a predetermined function. Although the device described in the following embodiment is preferably implemented by the software, implementation by the hardware or the combination of the software and the hardware is also possible and conceivable.

Figure 4:
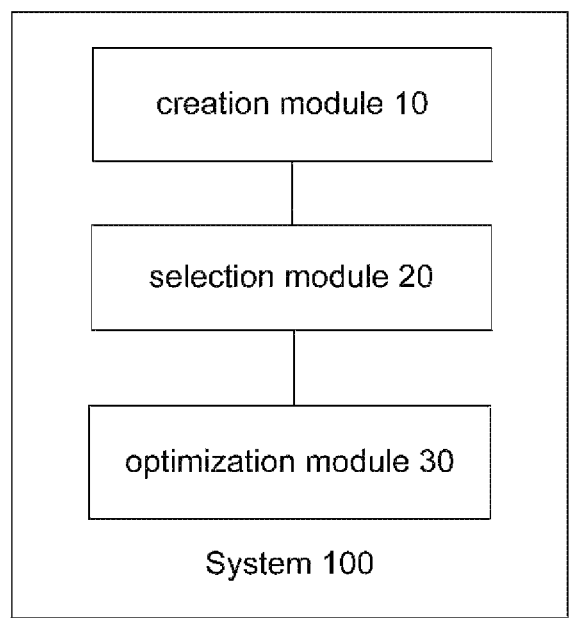
FIG. 4 is a structure block diagram of a system for optimizing a BMS model according to an embodiment of the present disclosure.

FIG. 4 is a structure block diagram of a system for optimizing a BMS model according to an embodiment of the present disclosure. As shown in FIG. 4, the system 100 includes a creation module 10, a selection module 20 and an optimization module 30.

The creation module 10 is configured to create a BMS model based on test data of a battery. The selection module 20 is configured to select sample vehicles from real driving data of vehicles equipped with this type of battery through active learning approach, and give a corresponding weight to each of the selected sample vehicles. The optimization module 30 is configured to optimize the BMS model based on the data of the selected sample vehicles.

Figure 5:
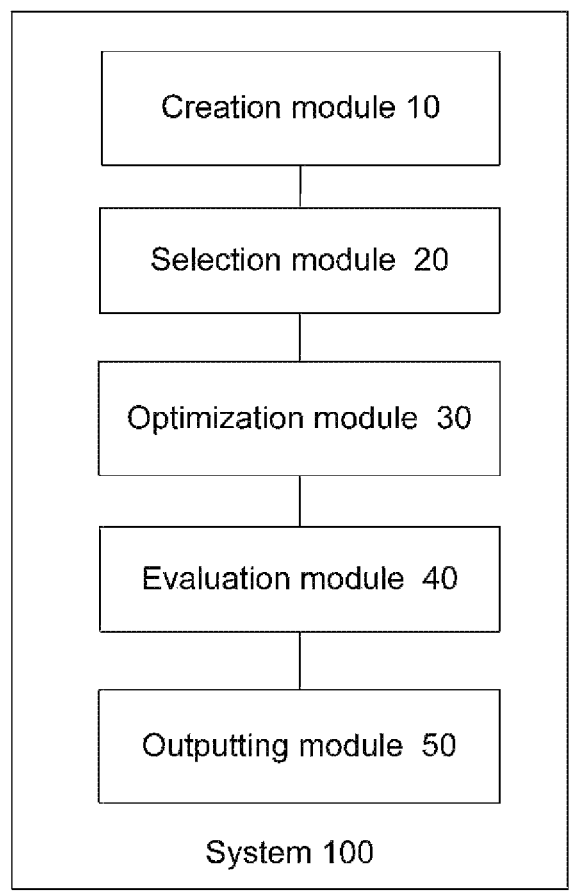
FIG. 5 is a structure block diagram of a system for optimizing a BMS model according to another embodiment of the present disclosure.

FIG. 5 is another structure block diagram of a system for optimizing a BMS model according to an embodiment of the present disclosure. As shown in FIG. 5, the system 100 further includes an evaluation module 40 and an outputting module 50.

The evaluation module 40 is configured to perform an error evaluation on the optimized BMS model. The outputting module 50 is configured to, when the optimized BMS model meets a preset accuracy requirement, output parameters of the optimized BMS model.

In the embodiment of the present disclosure, the battery laboratory test amount required for the BMS algorithm design is greatly reduced, and the cycle and cost of electric vehicle development are also reduced. At the same time, the BMS algorithm is fully optimized by using the driving data of users of various vehicle models using this type of battery to improve the performance and life of the battery system, and optimize the customer's vehicle driving experience.

Embodiment 4

According to the present embodiment, a non-volatile computer readable storage medium is provided, a program is stored in the non-volatile computer readable storage medium, and the program is configured to be executed by a computer to perform the following steps.

S1, creating a BMS model based on test data of a battery;

S2, selecting sample vehicles from real driving data of vehicles equipped with this type of battery through active learning approach, and giving a corresponding weight to each of the selected sample vehicles;

S3, optimizing the BMS model based on the data of the selected sample vehicles.

In an example embodiment, the storage medium may include, but not limited to, various media capable of storing program codes such as a U disk, a ROM, a RAM, a mobile hard disk, a magnetic disk or an optical disk.

Embodiment 5

Figure 6:
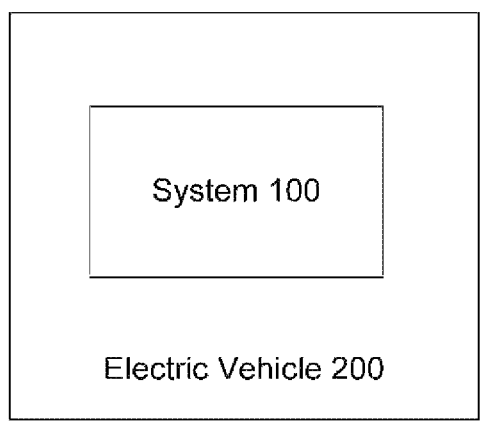
FIG. 6 is a structure block diagram of an electric vehicle according to an embodiment of the present disclosure.

According to the present embodiment, an electric vehicle is provided. As shown in FIG. 6, the electric vehicle 200 includes the system for optimizing a BMS model in abovementioned embodiments. It is to be noted that in the present embodiment the electric vehicle can be different kinds of NEVs, e.g. EV, HEV, PHEV, etc.

In the present embodiment, the system can select the actual driving data of various types of vehicles equipped with this type of battery through the active learning method, and then utilize the selected data to optimize the design of the BMS algorithm, thereby reducing the demand for laboratory battery test data and being closer to the actual use habits of users, which helps to improve the control accuracy of the BMS algorithm.

It is apparent that those skilled in the art should know that each module or each step of the present disclosure may be implemented by a universal computing device, and the modules or steps may be concentrated on a single computing device or distributed on a network formed by a plurality of computing devices, and may in an embodiment be implemented by program codes executable for the computing devices, so that the modules or the steps may be stored in a storage device for execution with the computing devices, the shown or described steps may be executed in sequences different from those described here in some circumstances, or may form individual integrated circuit module respectively, or multiple modules or steps therein may form a single integrated circuit module for implementation. Therefore, the present disclosure is not limited to any specific hardware and software combination.

The above is only the exemplary embodiments of the present disclosure and not intended to limit the present disclosure. For those skilled in the art, the present disclosure may have various modifications and variations. Any modifications, equivalent replacements, improvements and the like made within the spirit and principle of the present disclosure shall fall within the scope of protection of the present disclosure.

What is claimed is:

1. A method for optimizing a BMS model, comprising:
creating a BMS model based on test data of a battery;
selecting sample vehicles from real driving data of vehicles equipped with this type of battery through active learning approach, comprising: selecting the sample vehicles from real driving data of vehicles equipped with the battery based on a battery characteristic similarity between the sample vehicles and a target vehicle, wherein a battery characteristic of the battery comprises: a number of series/parallel connections of the battery, and a used time of the battery; and
giving a corresponding weight to each of the selected sample vehicles;
optimizing the BMS model based on the data of the selected sample vehicles.

2. The method according to claim 1, after optimizing the BMS model based on the data of the selected sample vehicles, the method further comprises:
performing an error evaluation on the optimized BMS model, and when the optimized BMS model meets a preset accuracy requirement, outputting parameters of the optimized BMS model.

3. The method according to claim 2, after performing an error evaluation on the optimized BMS model, the method further comprises:
when the optimized BMS model does not meet a preset accuracy requirement, reselecting sample vehicles from real driving data of vehicles equipped with the battery through the active learning approach, and optimizing the BMS model based on the data of the reselected sample vehicles.

4. The method according to claim 3, wherein reselecting sample vehicles from real driving data of vehicles equipped with the battery through the active learning approach comprises:
discarding part of the sample vehicles in which the information entropy is greater than a threshold value;
reselecting part of sample vehicles from real driving data of vehicles equipped with the battery through the active learning approach.

5. The method according to claim 1, further comprising:
creating a battery profile using driving data of a selected vehicle, wherein the battery profile comprises a SOC distribution, a current distribution, a voltage distribution, a balanced differential pressure distribution, a power distribution, an energy distribution, a balanced differential pressure; and
optimizing a test range and a test method based on the battery profile.

6. The method according to claim 1, wherein selecting the sample vehicles from real driving data of vehicles equipped with the battery based on a battery characteristic similarity between the sample vehicles and the target vehicle comprises:
determining the battery characteristic similarity between the sample vehicles and the target vehicle according to the information entropy of the sample vehicles;
selecting the sample vehicles from real driving data of vehicles equipped with the battery based on the information entropy of vehicles equipped with the battery.

7. The method according to claim 1, wherein the battery characteristic further comprises:
chemical characteristics of the battery.

8. The method according to claim 1, wherein the parameters of the BMS model comprise:
a model order, a battery charge state, an open circuit voltage, an internal resistance, a terminal voltage, and a capacitor.

9. A non-transitory computer readable medium containing computer instructions stored therein for causing a computer processor to perform a method for optimizing a BMS model, wherein the method comprises:
creating a BMS model based on test data of a battery;
selecting sample vehicles from real driving data of vehicles equipped with this type of battery through active learning approach, comprising: selecting the sample vehicles from real driving data of vehicles equipped with the battery based on a battery characteristic similarity between the sample vehicles and a target vehicle, wherein a battery characteristic of the battery comprises: a number of series/parallel connections of the battery, and a used time of the battery; and
giving a corresponding weight to each of the selected sample vehicles;
optimizing the BMS model based on the data of the selected sample vehicles.

10. The non-transitory computer readable medium according to claim 9, wherein the method further comprises:
performing an error evaluation on the optimized BMS model, and when the optimized BMS model meets a preset accuracy requirement, outputting parameters of the optimized BMS model.

11. The non-transitory computer readable medium according to claim 10, wherein after performing an error evaluation on the optimized BMS model, the method further comprises:
when the optimized BMS model does not meet a preset accuracy requirement, reselecting sample vehicles from real driving data of vehicles equipped with the battery through the active learning approach, and optimizing the BMS model based on the data of the reselected sample vehicles.

12. The non-transitory computer readable medium according to claim 9, wherein the method further comprises:
creating a battery profile using driving data of a selected vehicle, wherein the battery profile comprises a SOC distribution, a current distribution, a voltage distribution, a balanced differential pressure distribution, a power distribution, an energy distribution, a balanced differential pressure; and optimizing a test range and a test method based on the battery profile.

13. The non-transitory computer readable medium according to claim 9, wherein the parameters of the BMS model comprise: a model order, a battery charge state, an open circuit voltage, an internal resistance, a terminal voltage, and a capacitor.

14. The non-transitory computer readable medium according to claim 11, wherein reselecting sample vehicles from real driving data of vehicles equipped with the battery through the active learning approach comprises:
    discarding part of the sample vehicles in which the information entropy is greater than a threshold value;
    reselecting part of sample vehicles from real driving data of vehicles equipped with the battery through the active learning approach.

15. The non-transitory computer readable medium according to claim 9, wherein selecting the sample vehicles from real driving data of vehicles equipped with the battery based on a battery characteristic similarity between the sample vehicles and the target vehicle comprises:
    determining the battery characteristic similarity between the sample vehicles and the target vehicle according to the information entropy of the sample vehicles;
    selecting the sample vehicles from real driving data of vehicles equipped with the battery based on the information entropy of vehicles equipped with the battery.

16. The non-transitory computer readable medium according to claim 9, wherein the battery characteristic further comprises chemical characteristics of the battery.

17. An electric vehicle, comprising a system for optimizing a BMS model wherein the system comprises:
    creation module, is configured to create a BMS model based on test data of a battery;
    selection module, is configured to select sample vehicles from real driving data of vehicles equipped with this type of battery through active learning approach, comprising: selecting the sample vehicles from real driving data of vehicles equipped with the battery based on a battery characteristic similarity between the sample vehicles and a target vehicle, wherein a battery characteristic of the battery comprises: a number of series/parallel connections of the battery, and a used time of the battery;
    the selection module is further configured to give a corresponding weight to each of the selected sample vehicles; and
    optimization module, is configured to optimize the BMS model based on the data of the selected sample vehicles.

18. The electric vehicle according to claim 17, wherein the system further comprises:
    evaluation module, is configured to perform an error evaluation on the optimized BMS model;
    outputting module, is configured to, when the optimized BMS model meets a preset accuracy requirement, output parameters of the optimized BMS model.

* * * * *